United States Patent
Robert et al.

(10) Patent No.: US 11,058,037 B2
(45) Date of Patent: Jul. 6, 2021

(54) PERISTALTIC PUMP FOR ON-BOARD CHARGER THERMAL MANAGEMENT

(71) Applicant: Ford Global Technologies, LLC, Dearborn, MI (US)

(72) Inventors: Brian Joseph Robert, St. Clair Shores, MI (US); Serdar Hakki Yonak, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/453,487

(22) Filed: Jun. 26, 2019

(65) Prior Publication Data
US 2020/0413574 A1 Dec. 31, 2020

(51) Int. Cl.
*H05K 7/20* (2006.01)
*B60L 53/302* (2019.01)

(52) U.S. Cl.
CPC ........ *H05K 7/20945* (2013.01); *B60L 53/302* (2019.02); *H05K 7/20272* (2013.01); *H05K 7/20872* (2013.01); *H05K 7/20927* (2013.01)

(58) Field of Classification Search
CPC ............. H01L 23/473; H05K 7/20945; H05K 7/20872; H05K 7/20927; H05K 7/20272; B60L 53/302
See application file for complete search history.

(56) References Cited

U.S. PATENT DOCUMENTS

| 3,406,633 | A | * | 10/1968 | Schomburg | F04B 43/107 |
| | | | | | 417/394 |
| 3,429,272 | A | * | 2/1969 | Wilhite | F04B 43/0072 |
| | | | | | 417/474 |
| 3,545,538 | A | * | 12/1970 | Wilson | H01F 27/33 |
| | | | | | 165/175 |
| 5,088,522 | A | * | 2/1992 | Rath | F04B 43/0072 |
| | | | | | 138/119 |
| 6,149,394 | A | * | 11/2000 | Allen | F04B 43/1253 |
| | | | | | 417/63 |
| 9,901,014 | B2 | | 2/2018 | Robert et al. | |
| 10,138,880 | B2 | | 11/2018 | Robert et al. | |

(Continued)

OTHER PUBLICATIONS

Howell, David, Boyd, Steven, Cunningham, Brian, Gillard, Samm, Slezak, Lee, "Enabling Fast Charging: A Technology Gap Assessment," U.S. Department of Energy, Office of Energy Efficiency & Renewable Energy, Oct. 2017, 83 pages.

(Continued)

*Primary Examiner* — Adam B Dravininkas
(74) *Attorney, Agent, or Firm* — Brooks Kushman PC; David Kelly

(57) ABSTRACT

A vehicle on-board charging assembly includes at least one power electronics module and a coolant channel in thermal contact with the at least one power electronics module. The charging assembly also includes a first reactive portion along a wall of the coolant channel defining a first reactive property and a second reactive portion along the wall of the coolant channel defining a second reactive property. The charging assembly further includes a plurality of emitters arranged to activate the first and second reactive portions. The charging assembly also further includes a controller programmed to sequentially activate the emitters to cause peristaltic pumping of coolant through the coolant channel.

16 Claims, 5 Drawing Sheets

(56) References Cited

U.S. PATENT DOCUMENTS

| | | | | |
|---|---|---|---|---|
| 2002/0098098 A1* | 7/2002 | Miesner | ................... | F15B 7/00 |
| | | | | 417/477.1 |
| 2002/0184907 A1* | 12/2002 | Vaiyapuri | ............. | F04B 43/046 |
| | | | | 62/259.2 |
| 2004/0253123 A1* | 12/2004 | Xie | .................... | B81C 1/00119 |
| | | | | 417/410.1 |
| 2009/0209863 A1* | 8/2009 | Haveri | ................ | A61B 8/4483 |
| | | | | 600/459 |
| 2012/0004604 A1* | 1/2012 | Van Der Kamp | ...... | A61M 1/06 |
| | | | | 604/74 |
| 2014/0175867 A1* | 6/2014 | Sung | ................... | F16H 57/0412 |
| | | | | 307/9.1 |
| 2017/0303445 A1* | 10/2017 | Robert | ............... | H05K 7/20872 |
| 2018/0128257 A1* | 5/2018 | Robert | .................... | B60K 6/44 |

OTHER PUBLICATIONS

Johansen, Joachim Skov, "Fast-Charging Electric Vehicles Using AC," Technical University of Denmark, Master's Thesis, Sep. 2013, 158 pages.

Pan, Liwen, Zhang, Chengning, "An Integrated Multifunctional Bidirectional AC/DC and DC/DC Converter for Electric Vehicles Applications," Energies 2016, 9, 493, 23 pages.

Pinto, J.G., et al., "Bidirectional Battery Charger with Grid-to-Vehicle, Vehicle-to-Grid and Vehicle-to-Home Technologies," IEEE, 2013, 6 pages.

US Drive, Electrical and Electronics Technical Team Roadmap, Oct. 2017, 41 pages.

\* cited by examiner

US 11,058,037 B2

PERISTALTIC PUMP FOR ON-BOARD CHARGER THERMAL MANAGEMENT

TECHNICAL FIELD

This disclosure relates to thermal management systems for vehicle on-board charger systems.

BACKGROUND

Vehicles such as battery-electric vehicles (BEVs), plug-in hybrid-electric vehicles (PHEVs), mild hybrid-electric vehicles (MHEVs), or full hybrid-electric vehicles (FHEVs) contain a rechargeable energy storage device, such as a high voltage (HV) battery, to act as a propulsion source for the vehicle. Such vehicles may include on-board chargers to enable vehicles to interface with the power grid for recharging.

SUMMARY

A vehicle on-board charging assembly includes at least one power electronics module and a coolant channel in thermal contact with the at least one power electronics module. The charging assembly also includes a first reactive portion along a wall of the coolant channel defining a first reactive property and a second reactive portion along the wall of the coolant channel defining a second reactive property. The charging assembly further includes a plurality of emitters arranged to activate the first and second reactive portions. The charging assembly also further includes a controller programmed to sequentially activate the emitters to cause peristaltic pumping of coolant through the coolant channel.

A vehicle on-board charging assembly includes a thermal plate to support at least one power electronics module, the thermal plate having a coolant channel with a first reactive portion defining a first reactive property and a second reactive portion defining a second reactive property. The charging assembly also includes a set of emitters located proximate the coolant channel. The charging assembly further includes a controller programmed to selectively activate the emitters to cause movement of at least one reactive portion to cause peristaltic pumping of coolant through the coolant channel.

A vehicle electronics assembly includes at least one power electronics device disposed within a housing. The electronics assembly also includes a coolant channel disposed within the housing in thermal communication with the at least one power electronics device and having a first reactive portion defining a first reactive property and a second reactive portion defining a second reactive property. The electronics assembly further includes a set of emitters arranged with the coolant channel to form a peristaltic pump and a sensor to monitor thermal conditions of the power electronics device. The electronics assembly also further includes a controller programmed to activate the peristaltic pump based on signals received from the sensor to adjust a cross-sectional area of a portion of the coolant channel to induce peristaltic pumping.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ embodiments of the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

When recharging electrified vehicles such as battery electric vehicles (BEV) and/or plug-in hybrid vehicles (PHEV), charge time may be reduced using a highly-efficient on-board AC/DC charger having high power density. At the same time, often such power electronics devices may be subject to limited available package space and strict weight requirements. A vehicle on-board charger (OBC) provides a means to recharge the battery using an AC power supply such as at a home charging station or from outlets found in other private or public charging stations. Higher power density capabilities of the OBC, may benefit from dissipation of the heat generated with liquid cooled thermal management solutions. Such liquid cooled systems may pump coolant through a manifold structure that is in thermal contact with the power components of the OBC utilizing a closed loop path with single pump. As the coolant flows through the system it accumulates heat and a temperature gradient is created. Also, as the coolant flows through the system, the flow pattern may be disturbed due to complex bends and irregular shapes, further contributing to temperature gradients. And, as the cooling system's flow design becomes more complex it becomes more challenging to maintain continuous flow pressure within the system and thus thermal hot spots can arise near the power electronics components. The present disclosure provides systems and methods to mitigate such pressure drops within the coolant flow system as well as homogenize coolant temperatures. Such benefits may improve the thermal management system performance of a vehicle on-board charger.

Figure 1:
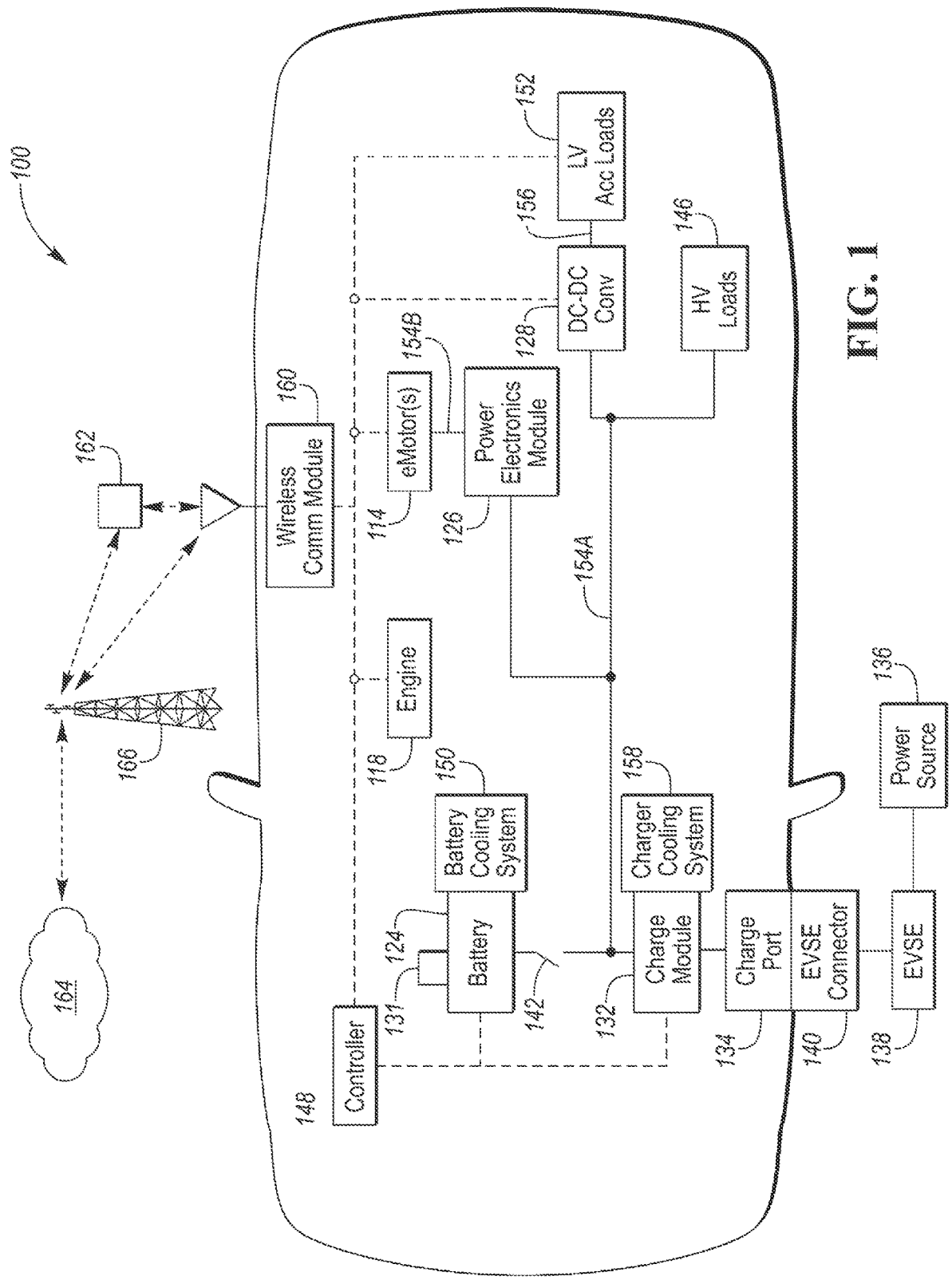
FIG. 1 is a schematic diagram illustrating an example of a vehicle with an electrified propulsion system.

FIG. 1 depicts a plug-in hybrid-electric vehicle (PHEV) 100. The PHEV 100 includes an electrified propulsion system having one or more electric machines 114 mechanically coupled to a hybrid transmission (not shown). Each of the electric machines 114 may be capable of operating either as a motor or as a generator. In addition, the hybrid transmission is mechanically coupled to an internal combustion engine 118. The electric machines 114 are arranged to provide propulsion torque as well as deceleration torque capability either while the engine 118 is operated or turned off. The electric machines 114 are capable of operating as generators to provide fuel economy benefits by recovering energy that would normally be lost as heat in a friction braking system. The electric machines 114 may additionally impart a reaction torque against the engine output torque to generate electricity for recharging a traction battery the while the vehicle is operating. The electric machines 114 may further reduce vehicle emissions by allowing the engine 118 to operate near the most efficient speed and torque ranges. When the engine 118 is off, the PHEV 100 may be operated in an electric-only drive mode using the electric machines 114 as the sole source of propulsion. The hybrid transmission is also mechanically coupled to road wheels to output torque from the electric machines 114 and/or combustion engine 118. While the topology of hybrid vehicle 100 is provided by way of example, aspects of the present disclosure may be applicable to any vehicle having an electrified propulsion system. Specifically, any electrified vehicle capable of recharging a high-voltage battery, such as battery electric vehicles (BEV's) and hybrid electric vehicles (HEV's), may benefit from the thermal preconditioning systems and methods of the present disclosure.

A rechargeable traction battery or battery pack 124 stores energy that can be used to power the electric machines 114. The battery pack 124 typically provides a high-voltage direct current (DC) output from one or more battery cell arrays, sometimes referred to as battery cell stacks, within the traction battery 124. Each battery cell array may include one or more battery cells. The battery cells, such as a prismatic, pouch, cylindrical, or other types of cells, are used to convert stored chemical energy to electrical energy. The cells may include a housing, a positive electrode (cathode) and a negative electrode (anode). An electrolyte allows ions to move between an anode and cathode during discharge, and then return during recharge. Terminals may allow current to flow out of the cell for use by the vehicle. Different battery pack configurations may be available to address individual vehicle variables including packaging constraints and power requirements. In some examples, different types of energy storage devices, such as capacitors and fuel cells (not shown) may supplement or replace the traction battery 124. Discussed in more detail below, the battery cells may be thermally regulated by a thermal-management system. Examples of thermal-management systems include air cooling systems, liquid cooling systems and a combination of air and liquid systems.

One or more contactors 142 may selectively isolate the traction battery 124 from a DC high-voltage bus 154A when opened and couple the traction battery 124 to the DC high-voltage bus 154A when closed. The traction battery 124 is electrically coupled to one or more power electronics modules 126 via the DC high-voltage bus 154A. The power electronics module 126 is also electrically coupled to the electric machines 114 and provides the ability to bi-directionally transfer energy between AC high-voltage bus 154B and the electric machines 114. According to some examples, the traction battery 124 may provide a DC current while the electric machines 114 operate using a three-phase alternating current (AC). The power electronics module 126 may convert the DC current to a three-phase AC current to operate the electric machines 114. In a regenerative mode, the power electronics module 126 may convert the three-phase AC current output from the electric machines 114 acting as generators to DC current compatible with the traction battery 124. The description herein is equally applicable to an all-electric vehicle without a combustion engine.

In addition to providing energy for propulsion, the traction battery 124 may provide energy for other vehicle electrical systems. The vehicle 100 may include a DC/DC converter module 128 that is electrically coupled to the high-voltage bus 154. The DC/DC converter module 128 may be electrically coupled to a low-voltage bus 156. The DC/DC converter module 128 may convert the high-voltage DC output of the traction battery 124 to a low-voltage DC supply that is compatible with low-voltage vehicle loads 152. The low-voltage bus 156 may be electrically coupled to an auxiliary battery 130 (e.g., a 12-volt battery). The low-voltage loads 152 may be electrically coupled to the low-voltage bus 156. The low-voltage loads 152 may include various controllers within the vehicle 100.

The traction battery 124 of vehicle 100 may be recharged by an off-board power source 136. The off-board power source 136 may include a connection to a power grid via an electrical outlet. The external power source 136 may be electrically coupled to a charging station or another type of electric vehicle supply equipment (EVSE) 138. The off-board power source 136 may also be an electrical power distribution network or grid as provided by an electric utility company. The EVSE 138 provides circuitry and controls to regulate and manage the transfer of energy between the power source 136 and the vehicle 100. The off-board power source 136 may provide DC or AC electric power to the EVSE 138. In the case of AC power provided by the power source 136, the EVSE 138 includes an AC-DC converter to convert the received AC power into DC power suitable for charging the traction battery 124. In turn, the EVSE 138 supplies the DC power to the traction battery 124 during recharging. The EVSE 138 also includes a charge connector 140 for plugging into a charge port 134 of the vehicle 100. The charge port 134 may be any type of port configured to transfer power from the EVSE 138 to the vehicle 100. The charge port 134 may be electrically coupled to a charge module or on-board power conversion module 132. The power conversion module 132 conditions power supplied from the EVSE 138 to provide the proper voltage and current levels to the traction battery 124. The power conversion module 132 interfaces with the EVSE 138 to coordinate the delivery of power to the vehicle 100. The EVSE connector 140 may have pins that mate with corresponding recesses of the charge port 134. Alternatively, various components described as being electrically coupled or connected may transfer power using wireless inductive coupling or other non-contact power transfer mechanisms. The charge components including the charge port 134, power conversion module 132, power electronics module 126, and DC-DC converter module 128 may collectively be considered part of a power interface system configured to receive power from the off-board power source 136.

When the vehicle 100 is plugged in to the EVSE 138, the contactors 142 may be in a closed state so that the traction battery 124 is coupled to the high-voltage bus 154 and to the power source 136 to charge the battery. The vehicle may be in the ignition-off condition when plugged in to the EVSE 138.

The traction battery 124 may also have one or more temperature sensors 131 such as thermistors or other types of temperature sensors. The temperature sensor 131 may be in communication with the controller 148 to provide data indicative of temperature of the battery cells. The vehicle 100 may also include temperature sensor 250 to provide data indicative of ambient air temperature. In the example schematic of FIG. 1, the temperature sensor 250 is disposed in a vehicle side mirror, but it should be appreciated that the temperature sensor may be located anywhere on the vehicle suitable to detect ambient temperature.

One or more high-voltage electrical loads 146 may be coupled to the high-voltage bus 154. The high-voltage electrical loads 146 may have an associated controller that operates and controls the high-voltage electrical loads 146 when appropriate. The high-voltage loads 146 may include compressors and electric heaters related to the vehicle climate control system 158. For example, the vehicle climate control system may draw high-voltage loads in the range of 6 kW-11 kW under high cooling loads. According to some examples, the rechargeable battery 124 supplies powers at least a portion of the climate control system 158.

The vehicle 100 further includes at least one wireless communication module 160 configured to communicate with external devices. over a wireless network. According to some examples, wireless communication module includes a BLUETOOTH transceiver to communicate with a user's remote device 162 (e.g., cell phone, smart phone, PDA, or any other device having wireless remote network connectivity). The remote device 162 can in turn be used to communicate with a network 164 outside the vehicle 100 through, for example, communication with a cellular tower 166. In some examples, tower 166 may be a WiFi access point.

Data may be communicated between the wireless communication module 160 and a remote network utilizing, for example, a data-plan, data over voice, or DTMF tones associated with the remote device 162. Alternatively, the wireless communication module 160 may include an onboard modem having antenna in order to exchange data with the network 164 over the voice band. According to some examples, the controller 148 is provided with an operating system including an API to communicate with modem application software. The modem application software may access an embedded module or firmware on the BLUETOOTH transceiver to complete wireless communication with a remote BLUETOOTH transceiver (such as that found in a nomadic device). Bluetooth is a subset of the IEEE 802 PAN (personal area network) protocols. IEEE 802 LAN (local area network) protocols include WiFi and have considerable cross-functionality with IEEE 802 PAN. Both are suitable for wireless communication within a vehicle. Another communication means that can be used in this realm is free-space optical communication (such as IrDA) and non-standardized consumer IR protocols.

In further example, remote device 162 includes a modem for voice band or broadband data communication. In the data-over-voice embodiment, a technique known as frequency division multiplexing may be implemented when the owner of the nomadic device can talk over the device while data is being transferred. At other times, when the owner is not using the device, the data transfer can utilize the entire bandwidth. Further data transfer protocols may also be suitable according to aspects of the present disclosure, for example, such as Code Domain Multiple Access (CDMA), Time Domain Multiple Access (TDMA), and Space-Domain Multiple Access (SDMA) for digital cellular communication.

The various components discussed may have one or more associated controllers to control, monitor, and coordinate the operation of the components. The controllers may communicate via a serial bus (e.g., Controller Area Network (CAN)) or via discrete conductors. In addition, a vehicle system controller 148 may be provided to coordinate the operation of the various components.

System controller 148, although represented as a single controller, may be implemented as one or more controllers. The controller 148 may monitor operating conditions of various vehicle systems. According to the example of FIG. 1, at least the electric machines 114, engine 118, traction battery 124, DC-DC converter 128, charging module 132, and high-voltage loads 146, low-voltage loads 152, and vision system 158 are in communication with the controller 148.

The controller 148 also generally includes any number of subcomponents such as microprocessors, ASICs, ICs, memory (e.g., FLASH, ROM, RAM, EPROM and/or EEPROM) and software code to co-act with one another to perform various operations. The subcomponents allow onboard processing of commands and execute any number of predetermined routines according to a desired timing or alternatively in response to one or more inputs received from vehicle systems. The processors may be coupled to non-persistent storage and/or persistent storage. In an example configuration, the non-persistent storage is RAM, and the persistent storage is flash memory. In general, persistent (non-transitory) storage can include all forms of storage that maintain data when a computer or other device is powered down. The controller 148 may also store predetermined data within the memory, such as "look up tables" that are based on calculations and/or test data. The controller communicates with other vehicle systems and sub-controllers over one or more wired or wireless vehicle connections and may use common bus protocols (e.g., CAN and LIN). Used herein, references to "a controller" refer to one or more controllers.

The traction battery 124 includes a current sensor to output a signal indicative of a magnitude and direction of current flowing into or out of the traction battery 124. The traction battery 124 also includes a voltage sensor to sense a voltage across terminals of the traction battery 124. The voltage sensor outputs a signal indicative of the voltage across the terminals of the traction battery 124. The traction battery 124 may also have one or more temperature sensors 131 such as thermistors or other types of temperature sensors. The temperature sensor 131 may be in communication with the controller 148 to provide data indicative of temperature of the battery cells.

The current sensor, voltage sensor, and temperature sensor outputs of the traction battery 124 are all provided to the controller 148. The controller 148 may be programmed to compute a state of charge (SOC) based on the signals from the current sensor and the voltage sensor of the traction battery 124. Various techniques may be utilized to compute the state of charge. For example, an ampere-hour integration may be implemented in which the current through the traction battery 124 is integrated over time. The SOC may also be estimated based on the output of the traction battery voltage sensor 104. The specific technique utilized may depend upon the chemical composition and characteristics of the particular battery.

A desired temperature operating range may also be specified for the traction battery. The temperature operating range may define upper and lower thermal limits within which the battery 124 is operated. In response to a sensed temperature approaching a temperature threshold, operation of the traction battery 124 may be modified or other mitigation actions may be initiated to actively regulate temperature. According to some example configurations, the traction battery 124 as well as other vehicle components are thermally regulated with one or more thermal-management systems that include cycling coolant to absorb heat generated by one or more power electronics devices.

Operations of electrified vehicle systems, such as on-board charging components, benefit from uniform temperature conditions. Liquid-cooled systems may force coolant through the system using a closed loop path with one pump. As the coolant flows through the system and draws heat a gradient of temperatures across the system may be created. Each of a battery cooling system 150 and a charger cooling system 158 may be provided to cycle coolant to thermally regulate the respective electronics components. In some examples each of the cooling modules is provided with its own coolant flow circuit. In other examples the coolant flow circuit of the battery cooling system 150 may be in fluid communication with the charger cooling system 158, such as by sharing a common coolant reservoir. Each of the battery cooling system 150 and the charger cooling system 158 may include a series of conduits, or channels, that are in thermal communication with electronics devices to remove heat generated by the electronics.

Based on available geometry within each cooling system, a coolant flow pattern may be disturbed due to various bends and/or irregular flow shapes which may contribute to temperature gradients. Peristaltic pumping within a conduit or channel may be caused by selectively decreasing and increasing a diameter along the flow path, thereby imparting a forward motion on the fluid. The present disclosure solution provides several ways to deliver a local, timed and controllable force to a thermal management system's pipes, tubes, and channels, reduce temperature gradients, and encourage more uniform flow pressure in spite of complex flow patterns. One or more peristaltic pumps may be included throughout the thermal management system to influence a flow of coolant within the system to assist in managing thermal conditions. According to some examples, a peristaltic pump may operate based on alternating between compression and relaxation of a coolant channel to urge liquid coolant through the channel.

Thermal management and temperature homogeneity of an OBC system may be enhanced by integrating active channel walls in the liquid cooling systems using peristaltic pumping mechanisms. For example magnetically or dielectrically driven synchronized motion may be applied to local flow areas to distribute pumping actuation. The local pumping assistance in turn serves to decrease fluid pressure drops, enhance flow regimes (laminar and/or turbulent), and reduce heat gradients within the thermal management system. Integration of these peristaltic pumps adjacent and/or within cooling flow channels induces mechanical motion supplementing coolant flow. Incorporating peristaltic pumping motion within the coolant channels of a thermal system fluid flow may be more finely controlled. Using a distributed system of moveable walls provides for the local and dynamic manipulation of fluid flow, enabling coolant motion (and hence thermal capacity) to be tailored, as well as altered real-time based on system performance. A system of moveable walls provided near key thermal system pathways allows for complex flow geometries to be used more efficiently, leading to a possible reduction or elimination of the incumbent pumping by one central pump. Moreover, a distributed system may benefit from inherent redundancy in the event of parts failure or channel fouling.

The mechanism for the peristaltic pumping can be provided in any of multiple ways. In some examples peristaltic pumping is either magnetically driven or dielectrically driven, thereby minimizing the complexity and quantity of moving parts in the system. Some magnetically-driven mechanisms apply electromagnets externally, but adjacent to the cooling channels themselves. Applying a magnetically reactive material such as iron or magnetic steel along with the coolant channel material, a generated magnetic field imparts a magnetic force on the thermal fluid piping. In a specific example, coolant piping maybe a flexible resin-based tube surrounded by a magnetic metal mesh to balance the ability to flex the pipe (e.g., formed from resin) while adding magnetic responsiveness (e.g., a metal mesh). In alternative examples, a dielectrically-driven mechanism may generate compression force on coolant channels of a thermal management system (e.g., piezoelectric or electrostriction materials) to achieve the desired fluid flow effect. In this manner, a series of piezoelectric materials could be placed along the exterior of a coolant channel. As each piezoelectric is activated electrically, a mechanical force could be imparted to the thermal system coolant channels that are provided with electrostriction materials which expand and/or contract in the presence of electrical fields. The electrostriction properties of materials such as Lead Magnesium Niobate (LMN) may be used to dielectrically communicate a force onto one or more coolant channels. By either using pieces or layers of electrostriction material and then delivering an electric field (such as by applying a local voltage), the desired force upon a coolant channel may be generated.

Figure 2:
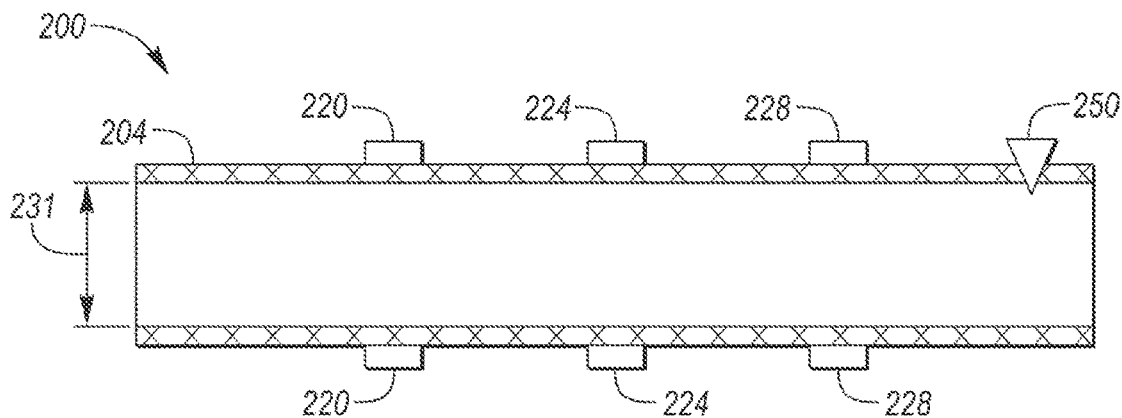
FIG. 2 is an illustrative schematic view, in cross-section, of a portion of a first example peristaltic pump assembly shown in a first configuration.

FIGS. 2 through 5 show a portion of an example of a peristaltic pump assembly in which magnetic field outputs may be used to drive peristalsis of a coolant channel or conduit of a thermal management system for an inductor system. In this example, the coolant channel 200 is shown disposed between a first set of electromagnets 220, a second set of electromagnets 224, and a third set of electromagnets 228. The coolant channel 200 may have various forms and shapes, such as a tube shape. FIG. 2 depicts the coolant channel 200 in a first configuration non-activated state. Different portions of the coolant channel 200 are shown in various compressed states in FIGS. 3 through 5. The coolant channel 200 may be a component of a larger conduit system to deliver coolant for thermally communicating with heat-generating electronics such on-board charging components. The cooling channel 200 also defines at least a portion of the flow path for coolant. Further, while coolant channel 200 is depicted as generally straight by way of example, packaging constraints and the locations charging components may drive the need for different curvature in peristaltic pump portions.

Examples of coolant suitable for use with the peristaltic pump assembly include at least glycol, water, mineral oil, and synthetic oil. The coolant channel 200 may also include magnetic particles dispersed throughout a layer 204, dispersed in selected portions of the coolant channel 200, or included in a component secured to the coolant channel 200. According to some examples, portions of wire mesh formed from magnetized metal are secured to an outer portion of the coolant channel 200. The layer 204 may be a flexible layer which may comprise a flexible resin-based material, such as polypropylene. The magnetic particles included with the layer 204 are represented by X's in FIGS. 2 through 5; however other configurations of magnetic particles may be suitable to facilitate peristalsis. Examples of materials having magnetic particles which may suitable for the layer 204 include at least magnetic steel and iron.

The electromagnet sets 220, 224, 228 may operate in a controlled sequence and be arranged to selectively output a magnetic field at different portions of the coolant channel 200. A controller, such as the system controller discussed above, may be in electrical communication with the electromagnet sets and may be programmed to selectively control their activation. More specifically, the controller may be programmed to activate the electromagnet sets in a sequence to facilitate a peristaltic pumping motion in which the cross-sectional area of the coolant channel 200 compresses and expands along a length or portion of the coolant channel 200.

With specific reference to FIG. 2, the first set of electromagnets 220, the second set of electromagnets 224, and the third set of electromagnets 228 are all shown deactivated and the coolant channel 200 is shown in a normal state. Dimension 231 represents a standard opening width across the coolant channel 200 in the natural state and in some examples represents a diameter of the coolant channel 200 for a cylindrically-shaped tube configuration. In other examples, the dimension 231 may represent a height or width of an alternatively-shaped tube.

Figure 3:
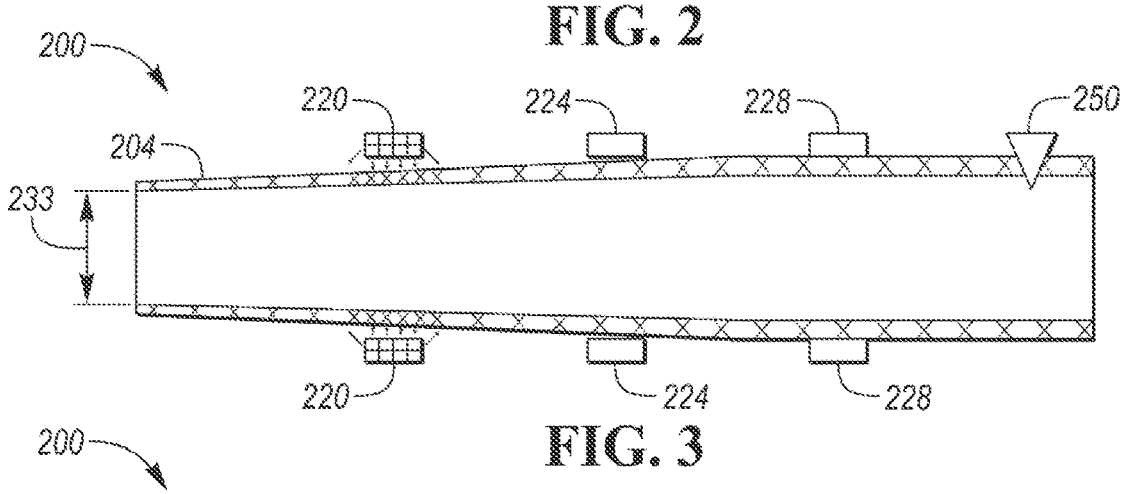
FIG. 3 is an illustrative schematic view, in cross-section, of the portion of the first example peristaltic pump assembly of FIG. 2 shown in a second configuration.

Referring to FIG. 3, the first set of electromagnets 220 are shown activated. A first portion of the coolant channel 200 proximate electromagnets 220 is shown compressed as a result of the magnetic field imparting a force (represented by arrows) upon the magnetic particles subject to the magnetic field. Dimension 233 is less than the dimension 231 and represents a reduced opening width across the coolant channel 200 at a compressed portion. In the example of a cylindrically-shaped tube, the dimension 233 corresponds to a reduced diameter of the coolant channel 200. The dimension 233 may represent a reduced height or width of an alternatively-shaped tube. The magnetic fields generated by the electromagnets 220 influence the magnetic particles to move and compress the flexible layer 204 to adjust a cross-sectional area of the coolant flow path defined by the coolant channel 200.

Figure 4:
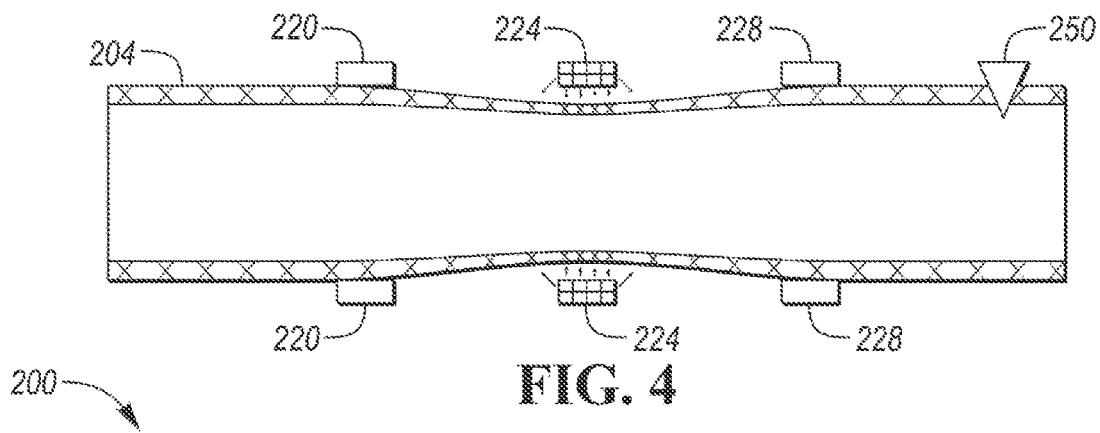
FIG. 4 is an illustrative schematic view, in cross-section, of the portion of the first example peristaltic pump assembly of FIG. 2 shown in a third configuration.
Figure 5:
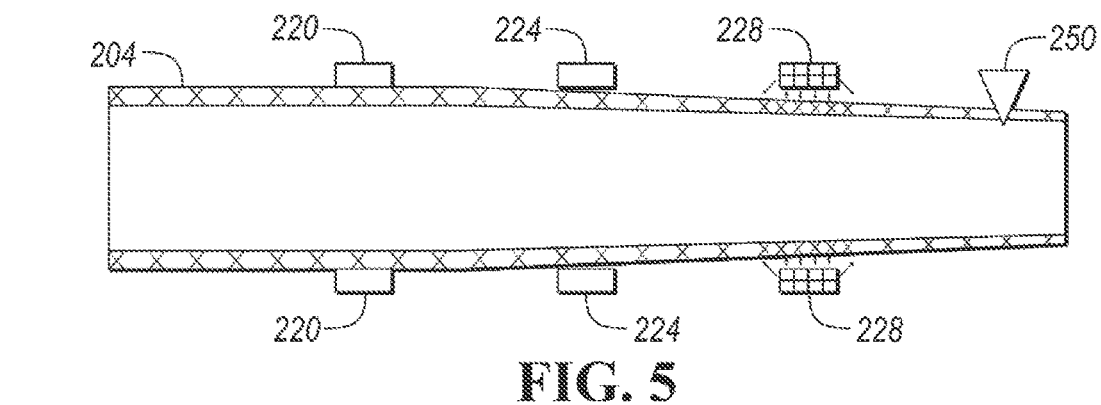
FIG. 5 is an illustrative schematic view, in cross-section, of the portion of the first example peristaltic pump assembly of FIG. 2 shown in a fourth configuration.

In FIG. 4, the second set of electromagnets 224 are shown activated. A second portion of the coolant channel 200 proximate electromagnets 224 is shown compressed as a result of a different magnetic field imparting a force upon magnetic particles at a different position along the coolant channel 200. In FIG. 5, the third set of electromagnets 228 are shown activated. A third portion of the coolant channel 200 proximate electromagnets 228 is shown compressed as a result of a third different magnetic field imparting a force upon magnetic particles at a third position along the coolant channel 200. Sequential activation of the sets of electromagnets compresses and then releases portions of the coolant channel 200 to promote peristalsis along the coolant channel 200. Flow rates of coolant traveling through the coolant channel 200 may thus be controlled with timing sequences of activating and deactivating the sets of electromagnets.

The controller may also be programmed to operate with one or more sensors. For example, the peristaltic pump system may include a sensor 250. The sensor 250 may be a flow rate sensor arranged with the coolant channel 200 to monitor flow conditions thereof. In other examples, a temperature sensor (not shown) may be arranged with the inductor to monitor temperature conditions thereof. The controller may be in electrical communication with the sensor 250 to selectively activate the sets of electromagnets based on sensor signals. In response to receiving the sensor signals, the controller may appropriately adjust a flow rate of the coolant within the coolant channel 200 by controlling operation of the sets of electromagnets to assist in managing thermal conditions of the on-board charging components. In some specific examples, a controller is programmed to activate the emitters based on a sensor-measured temperature relative to a predetermined temperature threshold.

While FIG. 2 through FIG. 5 depict electromagnets as an example mechanism to drive peristaltic pumping, other mechanisms may be suitable to sequentially constrict portions of a coolant channel to influence flow. In some examples, piezoelectric materials may be applied along the coolant channel to induce coolant flow. More specifically, a series of piezoelectric actuators may be spaced in series about the coolant channel. Each of the actuators is configured to locally constrict a channel opening when activated. Much like the previous examples, each of the piezoelectric actuators may be sequentially activated to induce peristaltic pumping. The degree of constriction may be controlled as a function of the current applied to each actuator. Thus, the coolant flow rate may be controlled electrically by influencing both the speed of the activation sequence as well as the magnitude of actuation of each of the sequence of piezoelectric actuators.

Incorporating one or more types of peristaltic pumping motions within a cooling conduit system, for example near an entry portion, intermediate coolant channel, and/or an exit portion may also provide additional control options relating to coolant flow. For example, a distributed system of coolant channels with moveable portions disposed along channel inner walls may influence coolant motion by locally and dynamically manipulating coolant flow at different locations with the conduit system. The moveable walls may be located at portions of the coolant flow path where geometry negatively impacts coolant flow, such as at bends or turns in the coolant channels.

Figure 6:
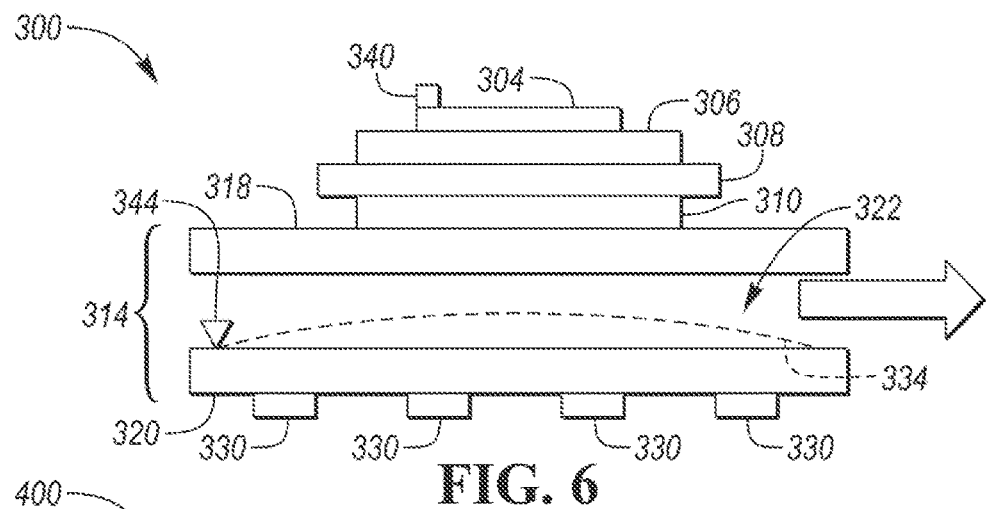
FIG. 6 is an illustrative schematic view, in cross-section, of a portion of a second example peristaltic pump assembly.

Referring to FIG. 6 an example of a portion of a power electronics assembly 300 is depicted. The power electronics assembly 300 may include a module including a power device 304, a first layer 306, a dielectric 308, and a second layer 310. The first layer 306, the dielectric 308, and the second layer 310 form a packaging assembly supporting the power device 304. Examples of the power device 304 may include transistors, diodes, or other similar components. Suitable materials for the first layer 306 and the second layer 310 may include aluminum and copper. The first layer 306 and the second layer 310 may be part of an electrical circuit to communicate signals of the power device 304 to other vehicle components. Suitable materials for the dielectric 308 may include aluminum oxide, aluminum nitride, and silicon nitride ceramics. A thermal plate 314 supports the packaging assembly thereupon. The thermal plate 314 include a first wall 318 and a second wall 320 that define a coolant channel 322 therebetween. The thermal plate 314 may be arranged with the power device 304 such that coolant flowing within the coolant channel 322 is in thermal communication with the power device 304. Coolant flowing within the coolant channel 322 may assist in managing thermal conditions, such as a temperature, of the power device 304 by drawing heat therefrom.

The second wall 320 may include particles which are actionable when subject to external forces. For example, the second wall 320 may include magnetic particles or dielectric particles. A force may be imparted on the magnetic particles by an electromagnet or a force may be imparted on the dielectric particles by a voltage or electric field. Positioning at least one emitter adjacent the second wall 320 may provide a peristaltic pump to impart a force upon the second wall 320 to adjust a cross-sectional area of a portion of the coolant channel 322. By adjusting this cross-sectional area, the peristaltic pump may operate to control a flow of coolant within the coolant channel 322.

For example, one or more emitters 330 may be mounted to an exterior of the second wall 320 and/or may be located adjacent the second wall 320. The one or more emitters 330 may output a magnetic field, a voltage, or an electric field in accordance with the type of particles included in the second wall 320 such that the one or more emitters 330 and the second wall 320 operate as a peristaltic pump. In FIG. 6, the one or more emitters 330 are sequentially activated to impart a force on particles along the second wall 320. Line 334, shown as a broken line, represents one particular activated configuration of the second wall 320. Similar to previous examples the cross-sectional area of the coolant channel 322 is adjusted to cause peristaltic pumping of coolant through the coolant channel by selectively adjusting a cross-sectional area along the channel.

In other examples, the line 334 may represent a membrane partially secured to the second wall 320 which may include actionable particles such that the membrane may move in response to the outputted magnetic field, voltage, or electric field. Activation of the emitters may drive a peristaltic motion to control a flow rate of the coolant flowing within coolant channel 322. A control system may operate with the one or more emitters 330 to adjust output of the peristaltic pump based on predetermined thresholds for operating conditions of the power electronics assembly 300.

A first sensor 340 may be in thermal communication with the power device 304 to monitor thermal conditions, such as temperature, of the power device. A second sensor 344 may be disposed within the coolant channel 322 to monitor a flow rate of coolant flowing therethrough. A controller is in electrical communication with the first sensor 340, the second sensor 344, and the one or more emitters 330. The controller may be programmed to operate the one or more emitters 330 based on signals received from the first sensor 340 and the second sensor 344. For example, a flow rate of coolant within the coolant channel 322 may be adjusted in response to, for example, a temperature of the power device 304 or a coolant flow rate of the coolant channel 322 being outside of a predetermined threshold. This example including the thermal plate 314 may be referred to as a single-sided thermal management system for a power electronics assembly.

Figure 7:
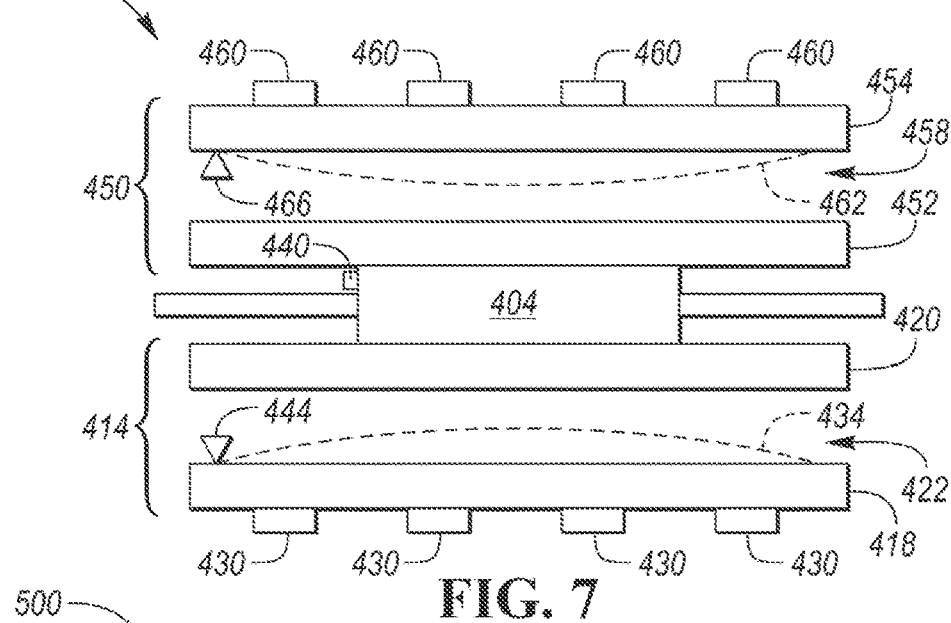
FIG. 7 is an illustrative schematic view, in cross-section, of a portion of a third example peristaltic pump assembly.

FIG. 7 shows an example of a portion of a power electronics assembly 400. The power electronics assembly 400 includes a module 404. Examples of components of the module 404 on-board charging components, for example, such as a charge module, inductors, power devices such as transistors or diodes, capacitors, and/or solenoids. The module 404 may also include a stack of metallic and dielectric layers as described above. A first thermal plate 414 supports the module 404. The first thermal plate 414 may include a first wall 418 and a second wall 420 that define a coolant channel 422. The first thermal plate 414 may be arranged with the module 404 such that coolant flowing within the coolant channel 422 is in thermal communication with the module 404 and related components. Coolant flowing within the coolant channel 422 may assist in managing thermal conditions, such as a temperature, of the module 404 by drawing heat therefrom.

The first wall 418 may include particles which are actionable when subject to external forces. For example, the first wall 418 may include magnetic particles or dielectric particles. A force may be imparted on the magnetic particles by an electromagnet or a force may be imparted on the dielectric particles by a voltage or electric field. Positioning a series of emitters adjacent the first wall 418 may provide a peristaltic pump to adjust a cross-sectional area of progressive portions of the coolant channel 422. By progressively adjusting the cross-sectional area, the peristaltic pump may operate to control a flow of coolant within the coolant channel 422. Said another way, a controller may be programmed to selectively activate the emitters to progressively reduce a coolant channel width along the coolant channel to cause peristaltic pumping of coolant through the coolant channel.

One or more emitters 430 are mounted to an exterior of the first wall 418 and/or may be located adjacent the first wall 418. The one or more emitters 430 may output a magnetic field, a voltage, or an electric field in accordance with the type of particles included in the first wall 418 such that the one or more emitters 430 and the first wall 418 operate as a peristaltic pump. In FIG. 7, the emitters 430 are sequentially activated to impart a force on particles within the second wall 420 resulting in an activated configuration of the first wall 418. Line 434, shown as a broken line, represents an adjusted cross-sectional area of the coolant channel 422 when at least some of the emitters 430 are activated. A different shape of line 434 may be generated when different ones of the emitters 430 are activated. In other examples, the line 434 may represent a membrane partially secured to the second wall 320 which may include actionable particles such that the membrane may move in response to the outputted magnetic field, voltage, or electric field. Sequential activation of the emitters may drive a peristaltic motion to control a flow rate of the coolant flowing within coolant channel 422.

A control system may operate with the one or more emitters 430 to adjust output of the peristaltic pump based on predetermined thresholds for operating conditions of the power electronics assembly 400. For example, a first sensor 440 may be in thermal communication with the power module 404 to monitor thermal conditions, such as temperature, of the power module 404. A second sensor 444 may be disposed within the coolant channel 422 to monitor a flow rate of coolant flowing therethrough. The controller may be in communication with the first sensor 440, the second sensor 444, and the one or more emitters 430. The controller is further programmed to activate one or more emitters 430 based on signals received from the first sensor 440 and the second sensor 444. For example, a flow rate of coolant within the coolant channel 422 may be adjusted in response to, for example, a temperature of the power module 404 or a coolant flow rate of the coolant channel 422 being outside of a predetermined threshold.

A second thermal plate 450 may be mounted to an opposing side of the power module 404 opposite the first thermal plate 414. This example including the first thermal plate 414 and the second thermal plate 450 may be referred to as a double-sided thermal management system for a power electronics assembly. The second thermal plate 450 may include a first wall 452 and a second wall 454 that define a coolant channel 458. The second thermal plate 450 may be arranged with the module 404 such that coolant flowing within the coolant channel 458 is in thermal communication with the module 404 and its components. Coolant flowing in the coolant channel 458 may assist in managing thermal conditions, such as a temperature, of the module 404 by drawing heat therefrom.

The second wall 454 may include particles which are actionable when subject to external forces. For example, and as described above, the second wall 454 may include magnetic particles or dielectric particles. A force may be imparted on the magnetic particles by an electromagnet or a force may be imparted on the dielectric particles by a voltage or electric field. Positioning an emitter adjacent the second wall 454 may provide a peristaltic pump to impart a force upon the second wall 454 to adjust a cross-sectional area of a portion of the coolant channel 458. By adjusting this cross-sectional area, the peristaltic pump may operate to control a flow of coolant within the coolant channel 458.

One or more emitters 460 are mounted to an exterior of the second wall 454 and/or may be located adjacent the second wall 454. The one or more emitters 460 output a magnetic field, a voltage, or an electric field in accordance with the type of particles included in the second wall 454 such that the one or more emitters 460 and the second wall 454 operate as a peristaltic pump. In FIG. 7, the emitters 460 are activated to impart a force on particles within the second wall 454 resulting in an activated configuration for the second wall 454, represented by line 462 shown as a broken line. The activated configuration adjusts the cross-sectional area of the coolant channel 458. In other examples, the line 462 represents a membrane partially secured to the second wall 454 which may include actionable particles such that the membrane moves in response to the outputted magnetic field, voltage, or electric field. As discussed above, activation of the emitters may drive a peristaltic motion to control a flow rate of the coolant flowing within coolant channel 458.

The control system may operate to adjust output of the peristaltic pump based on predetermined thresholds for operating conditions of the power electronics assembly 400. The first sensor 440 and third sensor 466 output signals to a controller which is programmed to control output of the one or more emitters 460 based on sensor signals. For example, a flow rate of coolant within the coolant channel 458 may be adjusted in response to, for example, a temperature of the power module 404 or a coolant flow rate of the coolant channel 458 being outside of a predetermined threshold. The double-sided thermal management system includes two sets of emitters and coolant channels on either side of one or more electronics components to effect cooling from opposing sides of the device.

Figure 8:
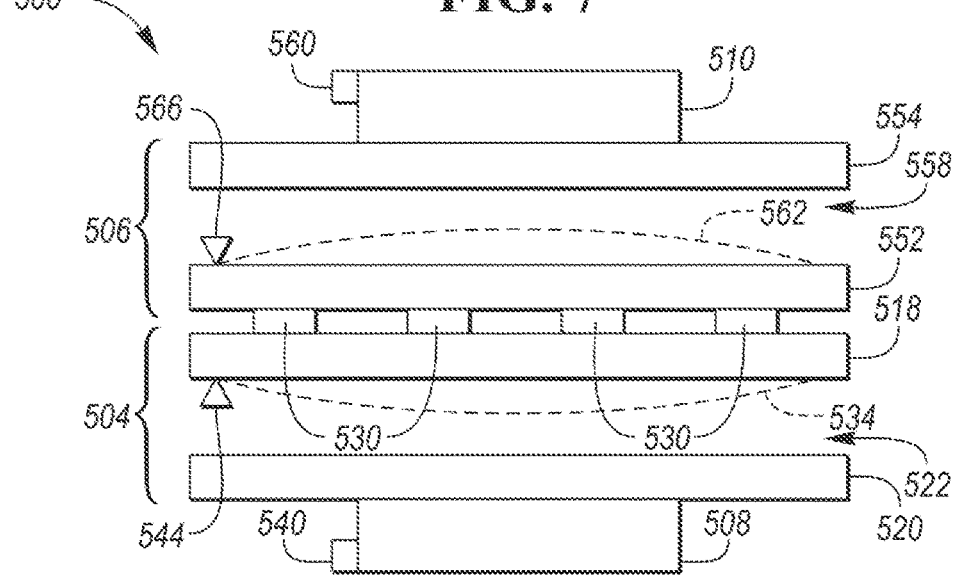
FIG. 8 is an illustrative schematic view, in cross-section, of a portion of a fourth example peristaltic pump assembly.

FIG. 8 shows an example of a portion of a power electronics assembly 500 that includes a first thermal plate 504, a second thermal plate 506, a first power electronics module 508, and a second power electronics module 510. The first power electronics module 508 is secured to the first thermal plate 504 and the second power electronics module 510 is secured to the second thermal plate 506.

The first thermal plate 504 includes a first wall 518 and a second wall 520 that define a coolant channel 522. The first thermal plate 504 is arranged with the module 508 such that coolant flowing within the coolant channel 522 is in thermal communication with the module 508 and its components. Likewise, the second thermal plate 506 includes a third wall 552 and a fourth wall 554 that define a coolant channel 558. And, the second thermal plate 506 is arranged with the module 510 such that coolant flowing within the coolant channel 558 is in thermal communication with the module 510 and its components. Coolant flowing within the coolant channels 522 and 554 assists in managing thermal conditions, such as a temperature, of each module by drawing heat therefrom. Similar to previous examples discussed above, one or more of sensors 540, 560, 544, and 566 may be in thermal communication with one or more power devices to monitor thermal conditions, such as temperature, of the power device. Also discussed above, certain sensors may be disposed within the coolant channels to monitor a flow rate of coolant flowing therethrough or coolant temperature. The example of FIG. 8 including the first thermal plate 504 and the second thermal plate 506 may be referred to as a dual-cooling thermal management system for a power electronics assembly.

Each of the first wall 518 and the third wall 552 may include particles which are actionable when subject to external forces. For example, the walls may include magnetic particles or dielectric particles. A force may be imparted upon magnetic particles by an electromagnet or alternatively upon dielectric particles by a voltage or electric field. In the example of FIG. 8, a series of emitters 530 are sandwiched between the first wall 518 and the third wall 552 such that a single series of emitters may induce peristaltic pumping within both plates. When the emitters 530 output a magnetic field, a voltage, or an electric field each of the first wall 518 and the third wall 552 each operate as a peristaltic pump. In FIG. 8 line 534, shown as a broken line, represents an active state of first wall 518 that corresponds to a reduced cross-sectional area of the coolant channel 522. Likewise, line 562, shown as a broken line, represents an active state of third wall 552. In other examples, the line 534 and line 562 may represent a membrane partially secured to each respective wall, where the membranes include actionable particles causing movement in response to the outputted magnetic field, voltage, or electric field. Sequential activation of the emitters may drive a peristaltic motion to control a flow rate of the coolant flowing within coolant channel 522.

Figure 9:
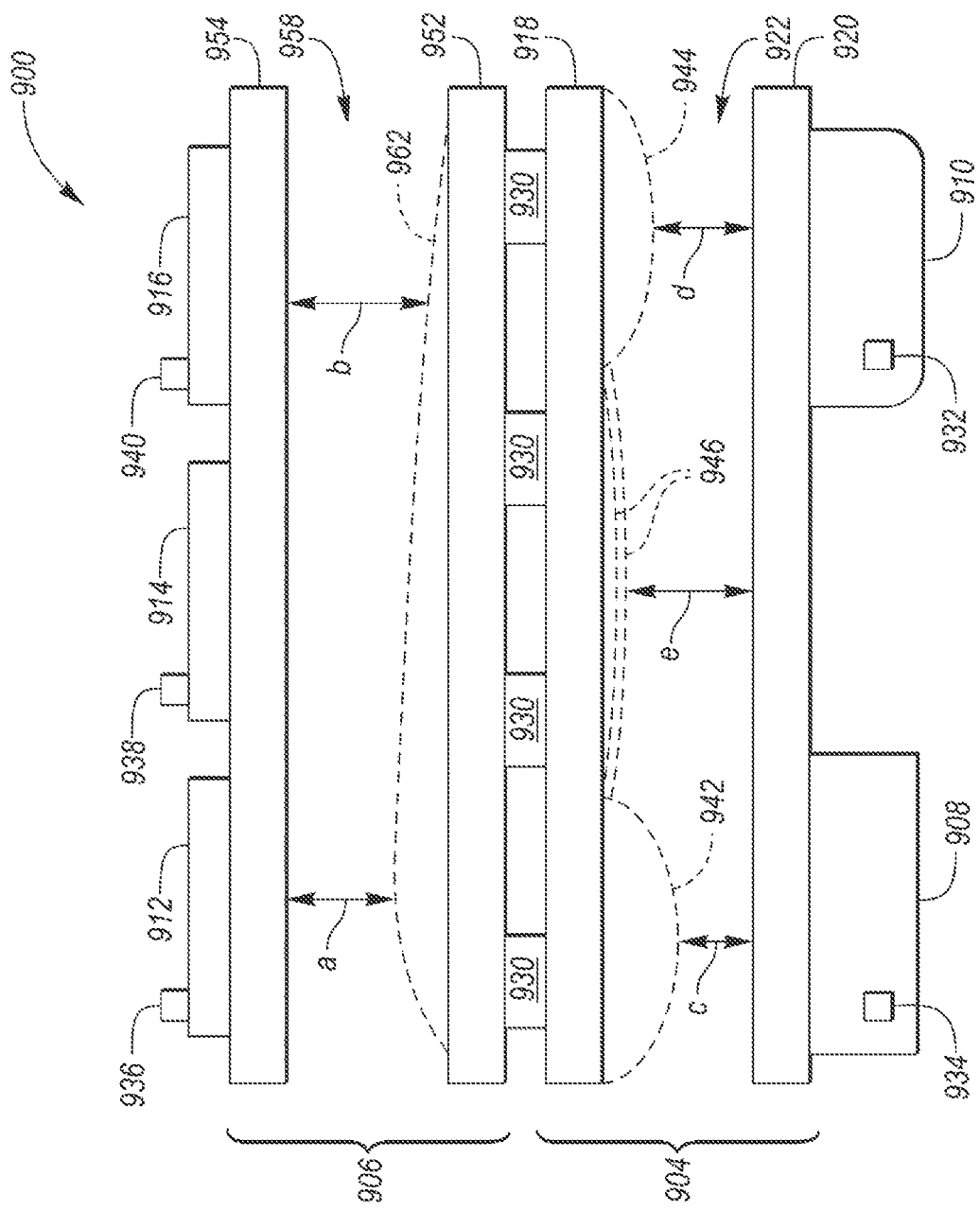
FIG. 9 is an illustrative schematic view, in cross-section, of a portion of a fifth example peristaltic pump assembly.

Referring to FIG. 9, a further example of a portion of a power electronics assembly 900 includes a first thermal plate 904, a second thermal plate 906, a first power electronics module 908, a second power electronics module 910, a third power electronics module 912, a fourth power electronics module 914, and a fifth power electronics module 916. Each of the power electronics modules are secured to one of the first thermal plate 904 and the second thermal plate 906. Moreover, each of the different electronics modules may exhibit unique heat-generating properties when operating. For example, each of the first power electronics module 908, second power electronics module 910, and third power electronics module 912 may be power devices. Conversely, each of fourth power electronics module 914, and fifth power electronics module 916 may be an inductor and a capacitor, respectively.

The first thermal plate 904 includes a first wall 918 and a second wall 920 that define a coolant channel 922. The first thermal plate 904 is arranged with the first and second power electronics modules 908, 910 such that coolant flowing within the coolant channel 922 is in thermal communication with the modules 908 and 910 and their related components. Likewise, the second thermal plate 906 includes a third wall 952 and a fourth wall 954 that define a coolant channel 958. And, the second thermal plate 906 is arranged with the modules 912, 914, 916 such that coolant flowing within the coolant channel 958 is in thermal communication with the modules and their related components. Coolant flowing within the coolant channels 922 and 954 assists in managing thermal conditions, such as a temperature, of each module by drawing heat therefrom. Similar to previous examples discussed above, one or more of sensors 932, 934, 936, 938, and 940 may be in thermal communication with one or more power devices to monitor thermal conditions, such as temperature, of the power device. Also discussed above, certain sensors may be alternately disposed within the coolant channels to monitor a flow rate of coolant flowing therethrough or coolant temperature. The example of FIG. 9 including the first thermal plate 904 and the second thermal plate 906 may be referred to as a dual-cooling thermal management system for a power electronics assembly.

Each of the first wall 918 and the third wall 952 includes particles, such as magnetic particles or dielectric particles, which are actionable when subject to external forces. A force may be imparted upon magnetic particles by an electromagnet or alternatively upon dielectric particles by a voltage or electric field. In the example of FIG. 9, a series of emitters 930 are sandwiched between the first wall 918 and the third wall 952 such that a single series of emitters may induce peristaltic pumping within both plates. When the emitters 930 output a magnetic field, a voltage, or an electric field each of the first wall 918 and the third wall 952 each operate as a peristaltic pump.

In FIG. 9 line 962, shown as a broken line, represents an active state of the third wall 952 that corresponds to a reduced cross-sectional area of the coolant channel 958. In some examples, the line 962 represents a membrane or peristaltic film partially secured to the third wall 952, where the membrane includes actionable particles causing movement in response to the outputted magnetic field, voltage, or electric field. Unlike other examples, the reactivity of the peristaltic film may differ across various portions of the coolant channel 958. As depicted in FIG. 9, a first cross-sectional width a of the channel is caused near the third power electronics module 912, and a second cross-sectional width b of the channel is caused near the fifth power electronics module 916. In this way, the flow properties of coolant through the channel 958 may be tailored according to the location of electronics components sought to be thermally regulated. The cross-sectional width may be varied, for example, by applying a non-uniform reactive property in different locations. In some specific examples a reactive property is varied between two locations by providing changing at least one of the stiffness, thickness, and/or polarity of the reactive portions of the peristatic element(s).

In another example, line 942 represents an active state of a first segment of the first wall 918 causing a third cross-sectional width c of the channel 922 near the first power electronics module 908. Line 944 represents an active state of a second segment of the first wall 918 causing a fourth cross-sectional width d of the channel 922 near the second power electronics module 910. Line 946 represents an active state of a third segment of the first wall 918 causing a fifth cross-sectional width e of the channel 922 between the first power electronics module 908 and the second power electronics module 910. The cross-sectional widths, and thus the peristaltic pumping properties, of the coolant channel 922 may be tailored by applying discrete reactive portions along the channel where each reactive portion may have different reactive properties. Sculpting the shape of the membrane allows for customization of the coolant flow properties based on the locations of the electronic devices. More specifically, cooling near the first power electronics module 908, the second power electronics module 910, and the area therebetween may be customized according to the heat generation of each of the individual devices. And, a uniform set of emitters 930 may be employed yet still provide a non-uniform active state of each of the first wall 918 and third wall 952.

Figure 10:
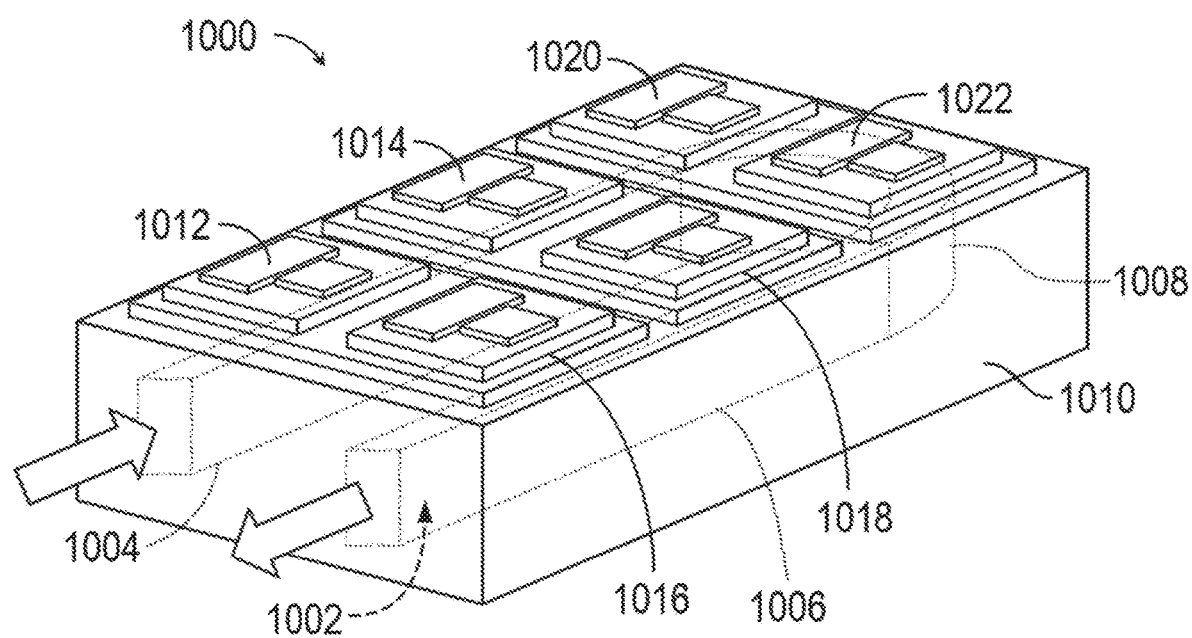
FIG. 10 is an illustrative perspective view of a sixth example peristaltic pump assembly.

Referring to FIG. 10, a thermal management system 1000 utilizes a peristaltic pump configured to flow coolant through a combination of various shapes. According to the example of FIG. 10, a portion of a peristaltic pump assembly includes a U-shaped coolant channel 1002. A first portion 1004 and a second portion 1006 each include a substantially straight flow path in fluid communication with a curved portion 1008 to define the U-shaped coolant flow path. While a U-shape is depicted by way of example, it is contemplated that the coolant channel may be provided with any number of different convoluted flow paths. Under certain conditions bends or curves along the coolant flow path may result in a pressure drop and/or a reduction in convective heat transfer efficiency. Thus, locating the reactive portions of the near such bends or curves may assist in combating pressure drops and/or reductions in convective heat transfer efficiency. Moreover, the reactive property of the coolant channel may be differed along the flow path by varying curvature of the flow path between a first reactive portion and a second reactive portion.

A support structure 1010 may house the coolant channel 1002, as well as a number of different electronic components. According to some examples, the support structure 1010 defines an internal cavity sized to receive the at least one coolant channel 1002. One or more power electronics devices may be arranged with the support structure 1010 for thermal communication with the coolant channel 1002. For example, the thermal management system 1000 may be arranged with the power electronics devices such that the coolant channel 1002 is shaped to provide various levels of cooling to different electronic devices with different heat emission. In some specific examples, first solenoid 1012 and second solenoid 1014 are located adjacent generally straight first portion 1004 of the coolant channel 1002. Similarly, first capacitor 1016 and second capacitor 1018 may be located adjacent generally straight second portion 1006 of the coolant channel 1002. Inductor 1020 and power device 1022 are located adjacent to curved portion 1008 of the coolant channel 1002. This orientation may provide for targeted delivery of coolant flowing within the coolant channel 1002 to draw heat from the different electronic devices according to individual thermal management needs. While FIG. 10 shows six electronic devices related to on-board charging, it is contemplated that more or less electronic devices may benefit from a structure in which the coolant channel 1002 is adjacent thereto. Moreover, while FIG. 10 depicts the different electronic devices having similar geometric shapes, it should be appreciated that the various electrical components may be provided with a range of different shapes and sizes according to each component's respective function.

Similar to certain examples described above, the peristaltic pump assembly may include one or more emitters to influence actionable particles within the coolant channel 1002. And the emitters and/or reactive portions of the coolant channel may be provided with different reactive properties according to the desired flow effect near a particular electronic device. More specifically, emitters placed near a high heat generating device may operate with higher current relative to other emitters to define a first reactive property and corresponding pumping force near the particular device. Conversely, emitters placed near devices that generate less heat may operate with less current to define a second reactive property and corresponding pumping force based on the cooling needs of the device. In further examples, the reactivity intensity of the reactive portions of the cooling channel is varied along the flow path while applying a generally consistent current to a number of emitters along the coolant channel.

While various embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to marketability, appearance, consistency, robustness, customer acceptability, reliability, accuracy, etc. As such, embodiments described as less desirable than other embodiments or prior art implementations with respect to one or more characteristics are not outside the scope of the disclosure and can be desirable for particular applications.

What is claimed is:

1. A vehicle on-board charging assembly comprising:
   a plurality of power electronics modules;
   a first coolant channel in thermal contact with a first power electronics module;
   a first reactive portion along a wall of the first coolant channel defining a first stiffness;
   a second coolant channel in thermal contact with a second power electronics module;
   a second reactive portion along the wall of the second coolant channel defining a second stiffness different than the first stiffness;
   a plurality of emitters arranged between the first and second coolant channels to activate the first and second reactive portions to cause compression on the coolant channels, wherein a magnitude of the compression on the first and second coolant channels activated by a same emitter are different due to the first and second stiffnesses; and
   a controller programmed to sequentially activate the emitters to cause peristaltic pumping of coolant through the coolant channel.

2. The assembly of claim 1 wherein at least one reactive portion includes magnetic particles and the plurality of emitters comprises electromagnets located adjacent the coolant channel arranged to emit a magnetic field to impart a force on the magnetic particles to move at least one reactive portion and cause peristaltic pumping by selectively reducing a coolant channel width.

3. The assembly of claim 1 wherein at least one reactive portion includes piezoelectric particles and the plurality of emitters are located adjacent the coolant channel and arranged to output an electric field or voltage upon the piezoelectric particles to move at least one reactive portion moves and cause peristaltic pumping by selectively reducing a coolant channel width.

4. The assembly of claim 1 wherein the first reactive portion is proximate a first one of the at least one power electronics module and the second reactive portion is proximate a second one of the at least one power electronics module.

5. The assembly of claim 1 wherein at least one of the first and second reactive portions includes a membrane partially secured to the wall and the plurality of emitters are arranged to move the membrane to cause peristaltic pumping by selectively reducing a coolant channel width.

6. A vehicle on-board charging assembly comprising:
   a thermal plate to support at least one power electronics module, the thermal plate having a first coolant channel with a first reactive portion defining a first polarity and a second coolant channel with a second reactive portion defining a second polarity different than the first polarity;
   a set of emitters located proximate the coolant channels; and
   a controller programmed to selectively activate the emitters to cause movement of at least one reactive portion to cause peristaltic pumping of coolant through the coolant channel, wherein a magnitude of the compression on the first and second coolant channels activated by a same emitter are different due to the first and second polarities.

7. The assembly of claim 6 wherein at least one reactive portion includes a membrane partially secured to a wall of the coolant channel, and the controller is further programmed to sequentially activate the set of emitters to move the membrane to cause peristaltic pumping by reducing a coolant channel width.

8. The assembly of claim 6 wherein at least one reactive portion includes magnetic particles, and the set of emitters comprises series of electromagnets, and the controller is further programmed to sequentially activate the series of electromagnets to output a magnetic force to move the magnetic particles to selectively adjust a cross-sectional area of the coolant channel to adjust a coolant flow rate.

9. The assembly of claim 6 wherein at least one reactive portion includes dielectric particles, and the set of emitters is arranged to output an electric field or voltage, and wherein the controller is further programmed to activate at least one emitter to move the dielectric particles to selectively adjust a cross-sectional area of the coolant channel to adjust a coolant flow rate.

10. The assembly of claim 6 wherein the first reactive portion causes formation of a first cross-sectional area when activated and the second reactive portion causes formation of a second cross-sectional area when activated.

11. A vehicle electronics assembly comprising:
    at least one power electronics device disposed within a housing;
    a first coolant channel and a second coolant channel disposed within the housing in thermal communication with the at least one power electronics devices, the first coolant channel having a first reactive portion defining a first thickness and the second coolant channel having a second reactive portion defining a second thickness different than the first thickness;

a set of emitters arranged with the coolant channel to form a peristaltic pump;

a sensor to monitor thermal conditions of the power electronics device; and a controller programmed to activate the peristaltic pump based on signals received from the sensor to adjust a cross-sectional area of a portion of the coolant channel to cause peristaltic pumping, wherein a magnitude of the compression on the first and second coolant channels activated by a same emitter are different due to the first and second thicknesses.

12. The assembly of claim 11, wherein the coolant channel comprises a wall having magnetic particles, and wherein the set of emitters includes electromagnets to selectively output a magnetic field to impart a force to move the magnetic particles to selectively adjust a cross-sectional area of the coolant channel to adjust a coolant flow rate.

13. The assembly of claim 11, wherein the coolant channel comprises a wall having dielectric particles, and wherein the set of emitters outputs a voltage or an electric field to impart a force to move the dielectric particles to selectively adjust a cross-sectional area of the coolant channel to adjust a coolant flow rate.

14. The assembly of claim 11, wherein the controller is further programmed to activate the set of emitters based on a sensor-measured temperature relative to a predetermined temperature threshold.

15. The assembly of claim 11, wherein the first reactive portion is proximate a first one of the at least one power electronics device and the second reactive portion is proximate a second one of the at least one power electronics device.

16. The assembly of claim 11, wherein at least one of the reactive portions includes a membrane partially secured to a wall of the coolant channel and the set of emitters are arranged to move the membrane and cause peristaltic pumping by selectively reducing a coolant channel width.

* * * * *